(12) United States Patent
Free et al.

(10) Patent No.: US 7,916,501 B2
(45) Date of Patent: *Mar. 29, 2011

(54) MAGNETIC SHIELD FOR USE IN A LOCATION SENSING SYSTEM

(75) Inventors: M. Benton Free, Saint Paul, MN (US); Bernard O. Geaghan, Salem, NH (US); Karl P. Hauck, Pembroke, NH (US); Albert H. Libbey, Eliot, ME (US); Billy Lee Weaver, Eagan, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/754,113

(22) Filed: Apr. 5, 2010

(65) Prior Publication Data
US 2010/0188832 A1 Jul. 29, 2010

Related U.S. Application Data (63) Continuation of application No. 11/617,352, filed on Dec. 28, 2006, now Pat. No. 7,787,259.

(51) Int. Cl.
*H05K 9/00* (2006.01)
(52) U.S. Cl. ..... 361/816; 361/818; 361/800; 178/18.07; 345/173; 174/350
(58) Field of Classification Search ................ 361/753, 361/799, 800, 816, 818; 178/18.07; 345/173; 174/350, 377
See application file for complete search history.

(56) References Cited

U.S. PATENT DOCUMENTS

| | | | |
|---|---|---|---|
| 3,072,849 A | 1/1963 | Firestone | |
| 3,617,922 A | 11/1971 | Bernstein | |
| 3,983,322 A | 9/1976 | Rodgers | |
| 4,029,869 A | 6/1977 | Ingram et al. | |
| 4,289,926 A | 9/1981 | Kobayashi | |
| 4,289,927 A | 9/1981 | Rodgers | |
| 4,353,552 A | 10/1982 | Pepper | |
| 4,360,790 A | 11/1982 | Heise | |
| 4,455,451 A * | 6/1984 | Kriz ........................ | 178/18.07 |

(Continued)

FOREIGN PATENT DOCUMENTS
CN 1512345 7/2004
(Continued)

OTHER PUBLICATIONS

U.S. Appl. No. 11/557,829, entitled "Touch Location Sensing System and Method Employing Sensor Data Fitting to a Predefined Curve," filed Nov. 8, 2006.

(Continued)

*Primary Examiner* — Dameon E Levi
(74) *Attorney, Agent, or Firm* — Johannes P. M. Kusters (57) ABSTRACT

An energy transfer apparatus with a magnetic shield is configured to magnetically couple energy from a fixed location to a mobile or moveable device within a field-activated space of the energy transfer apparatus. Apparatuses include a location sensing surface and a drive coil arranged in relation to a periphery of the location sensing surface. A magnetic shield plate is disposed below the location sensing surface and the drive coil. The shield plate includes a number of radially oriented slots originating at, and distributed about, a periphery of the shield plate.

6 Claims, 5 Drawing Sheets

U.S. PATENT DOCUMENTS

| | | | |
|---|---|---|---|
| 4,473,717 A | 9/1984 | Parnell et al. | |
| 4,672,154 A | 6/1987 | Rodgers et al. | |
| 4,686,332 A | 8/1987 | Greanias et al. | |
| 4,786,765 A | 11/1988 | Yamanami et al. | |
| 4,848,496 A | 7/1989 | Murakami et al. | |
| 4,878,553 A | 11/1989 | Yamanami et al. | |
| 4,893,115 A | 1/1990 | Blanchard | |
| 4,902,858 A | 2/1990 | Yamanami et al. | |
| 4,948,926 A | 8/1990 | Murakami et al. | |
| 4,956,526 A | 9/1990 | Murakami et al. | |
| 4,988,837 A | 1/1991 | Murakami et al. | |
| 4,999,461 A | 3/1991 | Murakami et al. | |
| 5,028,745 A | 7/1991 | Yamanami et al. | |
| RE33,740 E * | 11/1991 | Taguchi et al. | 178/18.07 |
| RE33,805 E | 1/1992 | Yamanami et al. | |
| 5,083,118 A | 1/1992 | Kazama | |
| 5,122,623 A | 6/1992 | Zank et al. | |
| 5,130,500 A | 7/1992 | Murakami et al. | |
| 5,138,118 A | 8/1992 | Russell | |
| RE34,187 E | 3/1993 | Yamanami et al. | |
| 5,191,175 A | 3/1993 | Protheroe et al. | |
| 5,194,819 A | 3/1993 | Briefer | |
| 5,218,173 A | 6/1993 | Garwin et al. | |
| 5,218,174 A | 6/1993 | Gray et al. | |
| 5,305,017 A | 4/1994 | Gerpheide | |
| 5,337,040 A | 8/1994 | Kind | |
| 5,369,227 A | 11/1994 | Stone | |
| 5,373,118 A | 12/1994 | Watson | |
| 5,374,787 A | 12/1994 | Miller | |
| 5,381,137 A | 1/1995 | Ghaem et al. | |
| 5,402,151 A | 3/1995 | Duwaer | |
| 5,414,227 A | 5/1995 | Schubert et al. | |
| 5,420,379 A | 5/1995 | Zank et al. | |
| 5,420,804 A | 5/1995 | Tanaka et al. | |
| 5,475,401 A | 12/1995 | Verrier et al. | |
| 5,486,847 A * | 1/1996 | Ranf et al. | 345/173 |
| 5,506,375 A | 4/1996 | Kikuchi | |
| 5,528,002 A | 6/1996 | Katabami | |
| 5,530,210 A | 6/1996 | Fukuzaki | |
| 5,557,076 A | 9/1996 | Wieczorek et al. | |
| 5,565,658 A | 10/1996 | Gerpheide et al. | |
| 5,571,997 A | 11/1996 | Gray et al. | |
| 5,594,215 A | 1/1997 | Jeng | |
| 5,619,431 A | 4/1997 | Oda | |
| 5,629,500 A | 5/1997 | Fukuzaki et al. | |
| 5,633,471 A | 5/1997 | Fukushima | |
| 5,644,108 A | 7/1997 | Katsurahira et al. | |
| 5,661,269 A | 8/1997 | Fukuzaki et al. | |
| 5,675,130 A | 10/1997 | Sekizawa | |
| 5,682,019 A | 10/1997 | Katsurahira et al. | |
| 5,691,512 A | 11/1997 | Obi | |
| 5,691,513 A | 11/1997 | Yamamoto et al. | |
| 5,693,914 A | 12/1997 | Ogawa | |
| 5,706,000 A | 1/1998 | Fukuzaki et al. | |
| 5,714,984 A | 2/1998 | Fukuzaki et al. | |
| 5,730,165 A | 3/1998 | Philipp | |
| 5,748,110 A | 5/1998 | Sekizawa et al. | |
| 5,751,229 A | 5/1998 | Funahashi | |
| 5,763,839 A | 6/1998 | Funahashi et al. | |
| 5,790,106 A | 8/1998 | Hirano | |
| 5,792,997 A | 8/1998 | Fukuzaki | |
| 5,793,360 A | 8/1998 | Fleck et al. | |
| 5,815,091 A | 9/1998 | Dames et al. | |
| 5,861,583 A | 1/1999 | Schediwy et al. | |
| 5,898,136 A | 4/1999 | Katsurahira | |
| 5,914,708 A | 6/1999 | LaGrange et al. | |
| 5,914,710 A | 6/1999 | Chen et al. | |
| 5,945,980 A | 8/1999 | Moissev et al. | |
| 5,973,677 A | 10/1999 | Gibbons | |
| 5,986,646 A | 11/1999 | Chen et al. | |
| 6,002,387 A | 12/1999 | Ronkka et al. | |
| 6,005,555 A | 12/1999 | Katsurahira et al. | |
| 6,020,849 A | 2/2000 | Fukuzaki | |
| 6,064,374 A | 5/2000 | Fukuzaki | |
| 6,075,468 A | 6/2000 | Sugiyama | |
| 6,118,435 A | 9/2000 | Fujita et al. | |
| 6,133,906 A | 10/2000 | Geaghan | |
| 6,137,427 A | 10/2000 | Binstead | |
| 6,178,818 B1 | 1/2001 | Plöchinger | |
| 6,249,234 B1 * | 6/2001 | Ely et al. | 341/20 |
| 6,307,385 B1 | 10/2001 | Tardif et al. | |
| 6,380,931 B1 | 4/2002 | Gillespie et al. | |
| 6,433,781 B1 | 8/2002 | Oda et al. | |
| 6,466,036 B1 | 10/2002 | Philipp | |
| 6,476,799 B1 | 11/2002 | Lee et al. | |
| 6,546,107 B1 * | 4/2003 | Bohnke | 381/189 |
| 6,549,096 B2 | 4/2003 | Groves et al. | |
| 6,576,850 B2 | 6/2003 | Fukushima et al. | |
| 6,587,098 B2 | 7/2003 | Teterwak | |
| RE38,286 E | 10/2003 | Flowers | |
| 6,667,740 B2 | 12/2003 | Ely et al. | |
| 6,670,561 B2 | 12/2003 | Aoki | |
| 6,690,156 B1 | 2/2004 | Weiner et al. | |
| 6,762,752 B2 | 7/2004 | Perski et al. | |
| 6,790,160 B2 * | 9/2004 | Kato et al. | 477/154 |
| 6,927,762 B2 | 8/2005 | Lin | |
| 6,970,160 B2 | 11/2005 | Mulligan et al. | |
| 7,019,672 B2 | 3/2006 | Ely | |
| 7,030,782 B2 * | 4/2006 | Ely et al. | 341/20 |
| 7,079,118 B2 | 7/2006 | Benard et al. | |
| 7,241,954 B2 * | 7/2007 | Kanai | 174/383 |
| 7,265,303 B2 * | 9/2007 | Thacker | 178/18.07 |
| 7,411,584 B2 | 8/2008 | Hill et al. | |
| 7,436,164 B2 | 10/2008 | Vos | |
| 7,453,444 B2 | 11/2008 | Geaghan | |
| 7,474,300 B2 | 1/2009 | Katsurahira et al. | |
| 7,787,259 B2 * | 8/2010 | Free et al. | 361/816 |
| 2002/0050983 A1 | 5/2002 | Liu et al. | |
| 2003/0001692 A1 | 1/2003 | Chiu et al. | |
| 2003/0067447 A1 | 4/2003 | Geaghan et al. | |
| 2003/0090347 A1 | 5/2003 | Losehand et al. | |
| 2004/0004488 A1 | 1/2004 | Baxter | |
| 2004/0092229 A1 | 5/2004 | Hessel | |
| 2004/0095333 A1 | 5/2004 | Morag et al. | |
| 2004/0104826 A1 | 6/2004 | Philipp | |
| 2004/0155871 A1 | 8/2004 | Perski et al. | |
| 2004/0233178 A1 | 11/2004 | Silk et al. | |
| 2005/0083307 A1 | 4/2005 | Aufderheide et al. | |
| 2005/0099188 A1 | 5/2005 | Baxter | |
| 2005/0128191 A1 | 6/2005 | Katsurahira et al. | |
| 2005/0146513 A1 | 7/2005 | Hill et al. | |
| 2005/0162411 A1 * | 7/2005 | van Berkel | 345/179 |
| 2005/0171714 A1 | 8/2005 | Ely et al. | |
| 2006/0016800 A1 | 1/2006 | Paradiso et al. | |
| 2006/0022959 A1 | 2/2006 | Geaghan | |
| 2006/0038628 A1 | 2/2006 | Khannur | |
| 2006/0114247 A1 | 6/2006 | Brown | |
| 2006/0125472 A1 | 6/2006 | Howard et al. | |
| 2007/0164833 A1 | 7/2007 | Kottschlag | |
| 2008/0106520 A1 | 5/2008 | Free et al. | |
| 2008/0116990 A1 | 5/2008 | Rokhsaz | |
| 2008/0128180 A1 | 6/2008 | Perski et al. | |
| 2008/0142281 A1 | 6/2008 | Geaghan | |
| 2008/0149401 A1 | 6/2008 | Hagen et al. | |
| 2008/0149402 A1 | 6/2008 | Vos | |
| 2008/0150550 A1 | 6/2008 | Vos | |
| 2008/0150658 A1 | 6/2008 | Vos | |
| 2008/0150917 A1 | 6/2008 | Libbey et al. | |
| 2008/0150918 A1 | 6/2008 | Hagen et al. | |
| 2008/0156546 A1 | 7/2008 | Hauck | |
| 2008/0158165 A1 | 7/2008 | Geaghan et al. | |
| 2009/0040193 A1 | 2/2009 | Geaghan | |
| 2009/0134960 A1 | 5/2009 | Larson et al. | |

FOREIGN PATENT DOCUMENTS

| | | |
|---|---|---|
| DE | 33 42 522 | 6/1985 |
| DE | 298 19 250 | 1/2000 |
| EP | 0 549 956 A1 | 7/1993 |
| EP | 0 607 694 B1 | 3/2000 |
| JP | 59-014043 | 1/1984 |
| JP | 07-319601 | 12/1995 |
| JP | 08-179871 | 7/1996 |
| JP | 09-046135 | 2/1997 |
| JP | 10-011206 | 1/1998 |
| JP | 11-024830 | 1/1999 |
| JP | 11-073270 | 3/1999 |
| JP | 11-249798 | 9/1999 |

| | | |
|---|---|---|
| JP | 2002-007054 | 1/2002 |
| JP | 2002-297300 | 10/2002 |
| JP | 2004-062729 | 2/2004 |
| JP | 2004-185153 | 7/2004 |
| KR | 10-0601151 | 7/2006 |
| KR | 10-0601151 B1 | 7/2006 |
| KR | 10-0601152 | 7/2006 |
| KR | 10-0601152 B1 | 7/2006 |
| WO | WO 92/08206 | 5/1992 |
| WO | WO 93/08551 | 4/1993 |
| WO | WO 96/18171 | 6/1996 |
| WO | WO 02/103622 A2 | 12/2002 |
| WO | WO 2004/021328 A2 | 3/2004 |
| WO | WO 2004/036147 A2 | 4/2004 |
| WO | WO 2004/040240 A1 | 5/2004 |
| WO | WO 2004/070396 A2 | 8/2004 |
| WO | WO 2006/133159 A2 | 12/2006 |

OTHER PUBLICATIONS

Paul Lorrain and Dale Corson, *Electromagnetic Fields and Waves*, 2d ed. W.H. Freeman and Company of San Francisco, CA (1970), pp. 150-152.

\* cited by examiner

MAGNETIC SHIELD FOR USE IN A LOCATION SENSING SYSTEM

CROSS REFERENCE TO RELATED APPLICATIONS

This application is a continuation of U.S. Ser. No. 11/617,352, filed Dec. 28, 2006, now issued as U.S. Pat. No. 7,787,259, the disclosure of which is incorporated by reference in its entirety herein.

BACKGROUND

The present invention relates generally to magnetic shielding apparatuses and, more particularly, to magnetic shield apparatuses that are of particular use in location sensing systems.

Personal computing systems of varying type and configuration typically provide one or more user interface devices to facilitate user interaction with such computing systems. Well known user interface devices include a keyboard, mouse, trackball, joystick, and the like. Various types of personal computing devices, such as tablet PCs, provide a pen apparatus that can be manipulated by the user, much in the same way as a pencil or ink pen.

Conventional computing devices that provide for user input via a pen or other pointer implement typically employ an electromagnetic inductive system. The electromagnetic inductive system usually comprises an electromagnetic pen or pointer apparatus and a digitizer in the form of a tablet. Changes in pen location relative to the digitizer's sensing surface are detected and location computations are made to determine the coordinates of the pen.

SUMMARY OF THE INVENTION

The present invention is directed to apparatuses that provide magnetic shielding. Embodiments of the present invention are directed to an energy transfer apparatus with a magnetic shield that magnetically couples energy from a fixed location to a mobile or moveable device within a field-activated space of the energy transfer apparatus.

According to various embodiments, apparatuses of the present invention may include a location sensing surface and a drive coil arranged in relation to a periphery of the location sensing surface. A magnetic shield plate is disposed below the location sensing surface and the drive coil. The shield plate includes a number of radially oriented slots originating at, and distributed about, a periphery of the shield plate. The shield plate may be fabricated from a ferrous metal, such as steel.

In some implementations, the shield plate may have relatively low reluctance along a first direction, and relatively high reluctance along a second direction, wherein the first direction is approximately orthogonal to the second direction. In other implementations, the shield plate may have relatively low reluctance along a radial direction, and relatively high reluctance along a circumferential direction.

In further implementations, the shield plate may have relatively low electrical resistance along a first direction, and relatively high electrical resistance along a second direction, wherein the first direction is approximately orthogonal to the second direction. In other implementations, the shield plate may have relatively low electrical resistance along a radial direction, and relatively high electrical resistance along a circumferential direction.

In some implementations, the shield plate may have relatively low reluctance along a first direction, and relatively high electrical resistance along a second direction, wherein the first direction is approximately orthogonal to the second direction. The first and second directions may vary relative to one another across a surface of the shield plate. The first direction may be oriented in alignment with a direction of a magnetic field generated by the drive coil. In further implementations, the shield plate may have relatively low reluctance along a radial direction, and relatively high electrical resistance along a circumferential direction.

The shield plate may include a bent portion extending along the periphery of the shield plate. At least some of the slots of the shield plate may be curved. At least some of the slots may have a curved portion situated near or at the drive coil, the curved portion oriented substantially perpendicular to the drive coil. The drive coil may be arranged in a substantially circular or rectangular shape. The shield plate may include one or more patterns of slots arranged near the drive coil and oriented parallel to the drive coil.

In accordance with other embodiments, apparatuses of the present invention may include a location sensing surface and a drive coil disposed relative to a periphery of the location sensing surface. A magnetic shield plate is disposed below the location sensing surface and the drive coil. The shield plate is preferably formed to provide a relatively low reluctance and electrical resistance in a first direction, and a relatively high reluctance and electrical resistance in a second direction, the second direction differing from the first direction.

The reluctance associated with the first and second directions may differ by a factor of 5:1 or greater. The electrical resistance associated with the first and second directions may differ by a factor of 5:1 or greater.

The first direction may be a substantially radially inward direction relative to a periphery of the shield plate, and the second direction may be a substantially circumferential direction relative to the periphery of the shield plate. The first direction may be substantially orthogonal to the second direction. The first and second directions may change relative to one another as a function of position across a surface of the shield plate. The first direction may be oriented generally in alignment with a direction of a magnetic field generated by the drive coil.

The above summary of the present invention is not intended to describe each embodiment or every implementation of the present invention. Advantages and attainments, together with a more complete understanding of the invention, will become apparent and appreciated by referring to the following detailed description and claims taken in conjunction with the accompanying drawings.

While the invention is amenable to various modifications and alternative forms, specifics thereof have been shown by way of example in the drawings and will be described in detail. It is to be understood, however, that the intention is not to limit the invention to the particular embodiments described. On the contrary, the intention is to cover all modifications, equivalents, and alternatives falling within the scope of the invention as defined by the appended claims.

DETAILED DESCRIPTION OF EMBODIMENTS

In the following description of the illustrated embodiments, reference is made to the accompanying drawings which form a part hereof, and in which is shown by way of illustration, various embodiments in which the invention may be practiced. It is to be understood that the embodiments may be utilized and structural changes may be made without departing from the scope of the present invention.

The present invention is generally directed to apparatuses that provide magnetic shielding for use in a variety of applications. In broad terms, the present invention is directed to an energy transfer apparatus with a magnetic shield that magnetically couples energy from a fixed location to a mobile or moveable device within a field-activated space of the energy transfer apparatus. Embodiments of magnetic shielding apparatuses of the present invention find particular usefulness in stylus location sensing devices, such as those that incorporate an electromagnetic digitizer.

Although the embodiments described herein are generally directed to stylus location sensing devices involving a digitizer or a touch-sensitive sensor in combination with a digitizer, it is understood that magnetic shielding apparatuses implemented in accordance with the principles of the present invention may be used in many other devices and applications. In this regard, the term digitizer used herein is intended to refer to a location sensing apparatus or energy transfer device that can be used in a variety of applications.

For example, apparatuses of the present invention may be configured to sense the location of game pieces on a game board. Identification or discrimination among game pieces on a game board or individual playing cards on a table may also be achieved, alone or in combination with location determinations, such as by providing each game piece or playing card with an RFID circuit having a unique resonance frequency, for example. Other location sensing devices and movable objects are contemplated, such as apparatuses configured to sense the location of a machine tool head or measure liquid level by sensing the location of a float.

Further, energy may be transferred from the location sensing device or source device to the movable object for purposes other than location detection or identification. For example, a display could be activated when a movable device is placed in the field-activated space of the display. One implementation may include a simple LCD device configured to change from opaque to transparent, revealing a game clue or a letter/number, for example. In other implementations, a low-power LED could illuminate when a movable device that includes the LED is placed within the field-activated space of the display or other form of energy transfer or sensing device.

Some digitizers have been developed that interact with untethered active styluses. Such styluses are generally configured for hand-held manipulation by a user, and are used as an input device. One method of supplying power to such a stylus is by coupling a magnetic field from a digitizer to the stylus. If the digitizer is transparent, the magnetic field is typically generated by a coil of wire or wires disposed around the periphery of the digitizer. For non-transparent digitizers, the coil of wire or wires may be disposed in the active area of the digitizer. The operating region of a digitizer is typically a large, flat rectangular area (e.g., ~1 Ft$^2$). The magnetic field is preferably distributed evenly over the stylus operating region. Low power is also preferable. Typical operating frequencies are in the range of 50 KHz to 200 KHz.

Surfaces of conductive material or low magnetic reluctance material parallel to the plane of the digitizer and nearby may create magnetic shorting paths to the magnetic coil that is intended to supply power to the stylus. These magnetic shorting paths result when the magnetic field induces eddy currents in a nearby conductive material. A number of solutions have been proposed, two of which are described below with reference to FIGS. 1 and 2.

Figure 1:
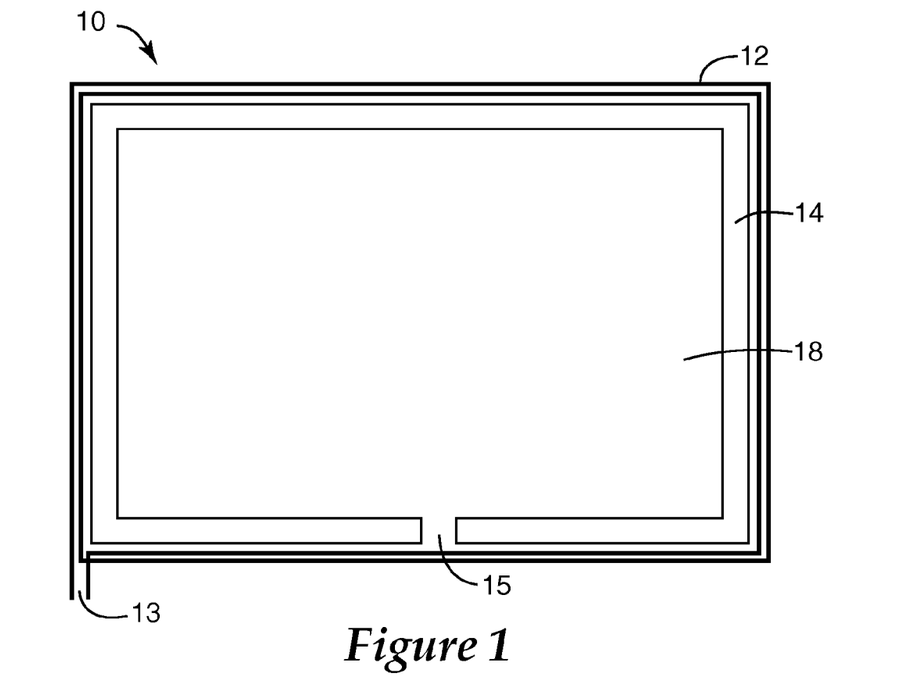
FIG. 1 shows a magnetic shielding apparatus positioned about the exterior of a metal bracket.

FIG. 1 shows a system 10 that incorporates a coil 12 positioned about the exterior of a metal bracket 14. Bracket 14 may be part of an LCD display located near (typically behind) the digitizer coil 12, or it may be part of the mechanical structure of system 10. The coil 12 generates a magnetic field when an AC signal is applied across the coil 12 at an input 13. The metal bracket 14 has a gap 15 that prevents circular electrical current, referred to as eddy currents, from flowing around the length of the metal bracket 14. Bracket 14 has a large open area 18, so it does not provide substantial shielding of magnetic flux generated by coil 12.

Figure 2:
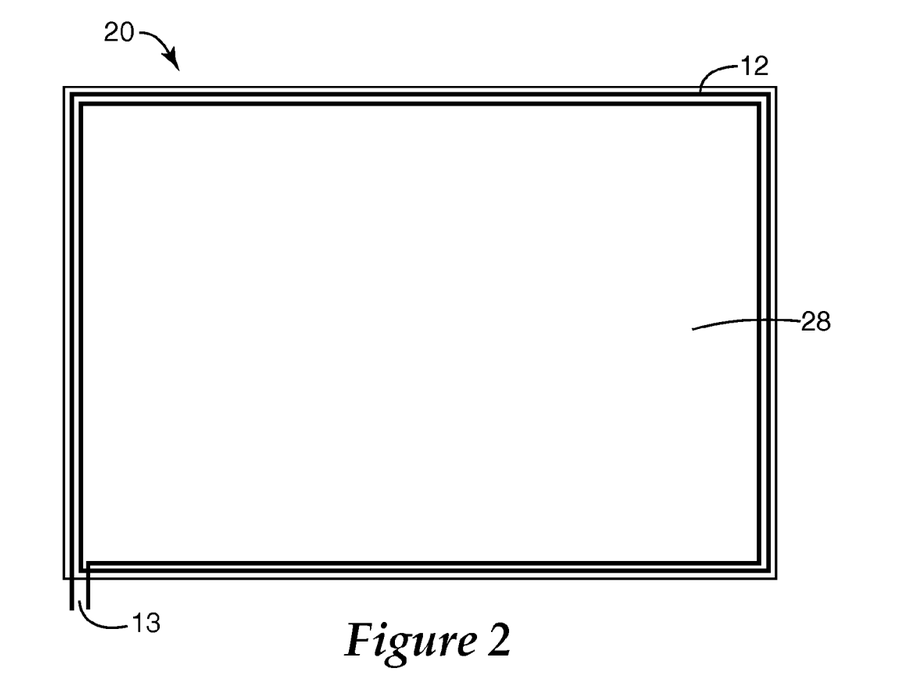
FIG. 2 shows a magnetic shielding apparatus positioned about the periphery of ferrite shield material.

FIG. 2 shows a known system 20 that incorporates a coil 12 positioned about the periphery of ferrite shield material 28. The coil 12 generates a magnetic field when an AC signal is applied across the coil 12 at an input 13. The ferrite shield material 28 largely prevents magnetic fields from penetrating through shield 28 and extending behind shield 28. In addition, significant eddy currents cannot flow in the electrically resistive ferrite material 28. Ferrite material, however, is prohibitively expensive in many applications. High silica steel has been proposed as an alternative material, but has too high an electrical conductivity so it will support excessive eddy currents, and is also prohibitively expensive in many applications.

A magnetic shielding apparatus of the present invention provides excellent magnetic shielding performance while being fabricated from low cost materials. In the case of a magnetic shield of the present invention being used in the context of an electromagnetic digitizer, such a magnetic shield advantageously reduces or minimizes magnetic reluctance so that a magnetic field can be generated over the top of the digitizer with minimum power applied. A magnetic shield of the present invention may also minimize eddy currents that would reduce magnetic field strength in the stylus operating area. A magnetic shield of the present invention may further shield the magnetic field from radiating behind the digitizer surface.

According to embodiments of the present invention, a magnetic shield may be fabricated from a low cost ferrous metal, such as steel, and include a number of apertures that are aligned with desired magnetic flux lines. A magnetic shield according to embodiments of the present invention may be configured to shape a magnetic field preferentially in a desired direction, such as a radial direction. For example, a magnetic shield may be fabricated to include radial slots aligned with the desired magnetic flux lines.

In the context of an electromagnetic digitizer, a magnetic shield of the present invention may be employed as a magnetic field shaping shield, such that the shield shapes a magnetic field preferentially in a desired manner or direction, such as in a radial direction. The shield may also direct electrical current flow in a desired direction, such as in a radial direction. The edges of the magnetic shield may be bent upward at a desired angle to further reduce the reluctance path of flux generated by the drive coil of the digitizer.

In accordance with various embodiments, a magnetic shield of the present invention may be incorporated in an electromagnetic digitizer to provide for magnetic shielding and magnetic field shaping. According to such embodiments, a magnetic field is generated over the surface of a digitizer and couples power and signals to an untethered stylus. The magnetic field is generated by a coil of wire or wires disposed around the periphery of the digitizer. The magnetic shield, fabricated from a ferrous metal plate, maximizes field strength over the surface of the digitizer at minimum applied power (by minimizing reluctance of the magnetic field), and minimizes magnetic field coupling to nearby conductive components. The shield plate is provided with a number of radial slots that reduce or minimize eddy currents.

Figure 3A:
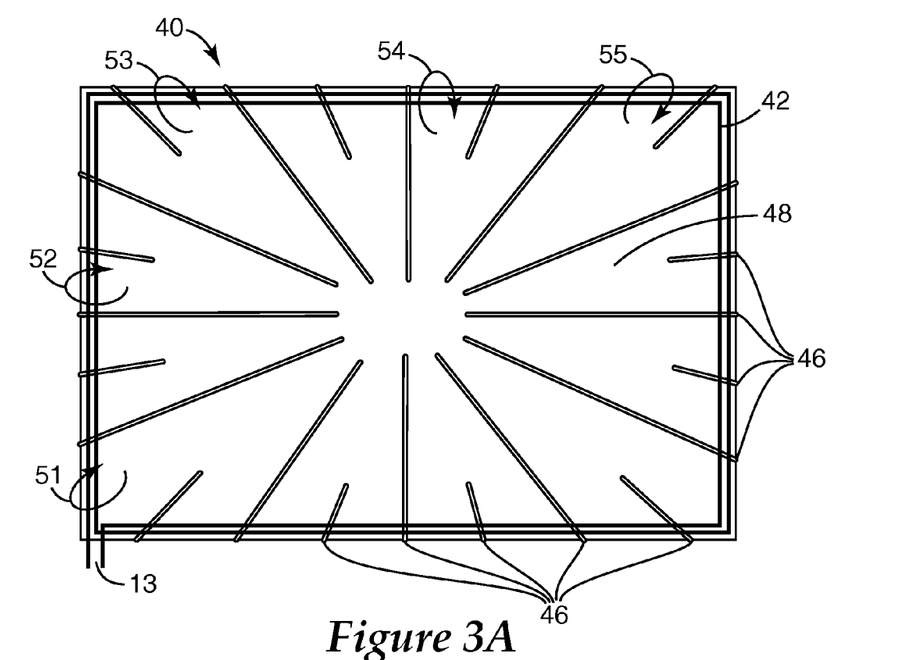
FIG. 3A shows a magnetic shielding apparatus according to embodiments of the present invention.
Figure 3B:
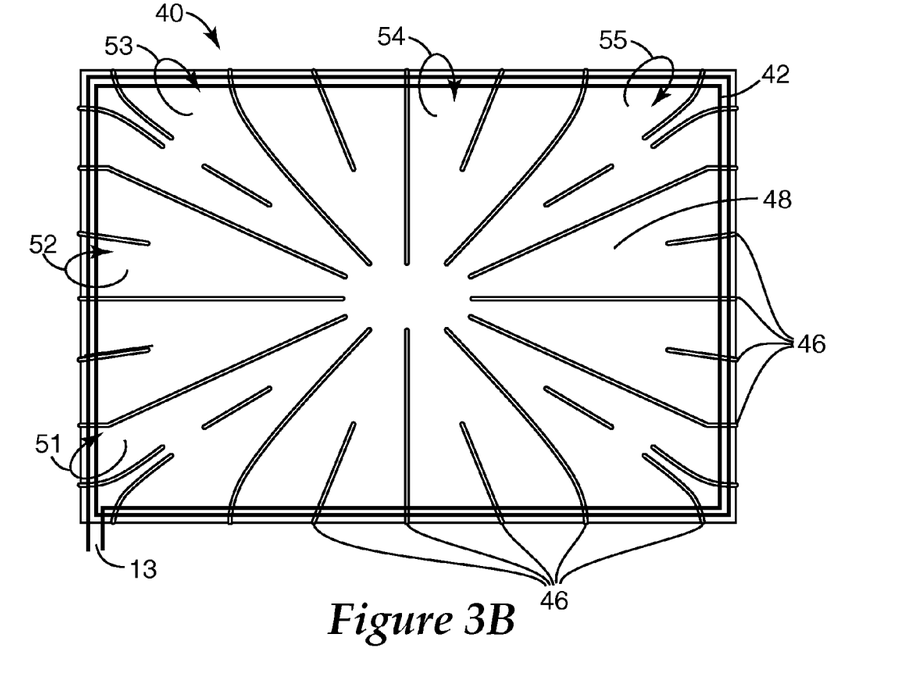
FIG. 3B shows a magnetic shielding apparatus according to other embodiments of the present invention.
Figure 3C:
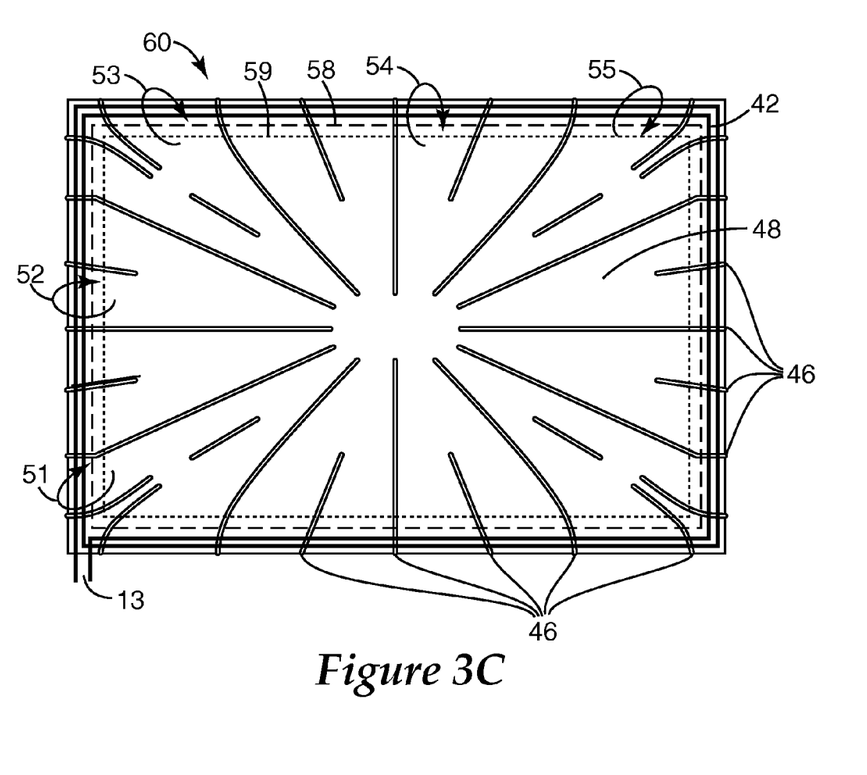
FIG. 3C shows a magnetic shielding apparatus according to further embodiments of the present invention.

FIGS. 3A-3C show various configurations of a magnetic shielding apparatus according to embodiments of the present invention. The apparatus 40 shown in FIG. 3A includes a shield plate 48 and a coil 42 disposed about a peripheral portion of the shield plate 48. The coil 42 generates a magnetic field when an AC signal is applied across the coil at input 13. Although coil 42 is shown arranged in a generally rectangular shape, coil 42 may be arranged according to other shapes, such as squares, circles, and ellipses, among others. In a typically system configuration, the shield plate 48 is positioned behind the coil 42 and preferably behind a display (not shown), such as an LCD for example.

The shield plate 48 is preferably formed from a ferrous metal, such as steel, or other material that provides a low reluctance path for magnetic fields 51-55, for example, induced by coil 42. The shield plate 48 provides a low reluctance path for magnetic fields, such as fields 51-55, and also largely prevents magnetic fields generated by coil 42 from penetrating through shield plate 48.

FIGS. 3A-3C show a number of slots 46 provided in the shield plate 48. The slots 46 may be arranged in a variety of ways in the shield plate 48 for purposes of preferentially directing magnetic flux. In general, it is desirable that the magnetic flux follow the radial paths between the radial slots 46.

The density of a magnetic field is referred to as flux, or more precisely, magnetic flux is the product of the average magnetic field multiplied by the perpendicular area that it penetrates. Magnetic flux tends to follow the path of lowest reluctance, akin to electric current following the path of least resistance. As such, magnetic flux follows the paths provided between the slots 46 in the low-reluctance metal shield plate 48.

FIG. 3A further shows a number of slots 46 that originate at the peripheral edge of the shield plate 48 and have a generally radial direction. As shown, the slots 46 are distributed about the periphery of the shield plate 48 and define discontinuities along the shield plate's peripheral edge. The slots 46 are also shown to vary in length, and may also vary in terms of width.

In FIG. 3A, alternating long and short slots 46 are shown distributed about the periphery of the shield plate 48. The slots 46 are shown directed in a radial manner toward a central location of the shield plate 48.

In general terms, the slots 46 are situated within the shield plate 48 in a manner that reduces or minimizes eddy currents. For example, the radial slots 46 shown in FIG. 3A prevent significant eddy currents from flowing radially around the periphery of shield 48. It is understood that the slots 46 may have varying lengths and widths, and that these dimensions may vary as a function of position across the shield plate 48. Slots may originate at the edges of shield plate 48 or both ends of a slot may be located within the surface of the shield plate 48. Slots may also follow curved paths that vary with the slot position.

The slots 46 provided in the shield plate 48 of the shield apparatus 40 shown in FIG. 3A are generally straight. In FIGS. 3B and 3C, many of the slots 46 of shield apparatuses 50 and 60 are curved or have curved portions proximate the coil 42. Because the magnetic flux emanating from the 42 coil is perpendicular to the coil 42, it may be beneficial to bend the slots 46 so that the slot portions near the coil 42 are oriented substantially perpendicular to the coil 42. The magnetic flux will preferentially follow the curved path of the curved slots 46 cut into the shield plate 48.

FIG. 3C shows another configuration of a shield plate 48 according to embodiments of the present invention. The shield plate 48 of FIG. 3C is identical to that shown in FIG. 3B, except that rectangular patterns of short slots 58, 59 have been added. These patterns of short slots 58, 59 are arranged near the coil 42. The slots 58, 59 are preferably numerous, short in length, and oriented generally perpendicular to the field-guiding slots 46.

Generally, short slots 58, 59 have a higher density (i.e., more shield material is removed) nearer to the coil 42 and a lower density of removed material further from the coil 42. Unlike slots 46, slots 58, 59 are intended to increase the reluctance of the shield nearest to coil 42, relative to the reluctance nearer the center of the shield 48. This has the effect of making the magnetic field more uniform across the surface of the shield 48, by reducing field strength near coil 42. The overall field strength may be reduced as a result of short slot patterns 58 and 59.

The shield plate 48 may be fabricated to include apertures other than slots. For example, pie shaped apertures or apertures of other shapes may be employed, alone or in combination with radial slots. Moreover, the direction of such apertures need not be directed exclusively in a radial direction, and apertures of greater complexity may be included that have more than one direction (e.g., a primary aperture feature having a primary direction and a secondary aperture feature having a secondary direction, where the primary and secondary directions may be different). Accordingly, the aperture configurations and orientations differing from those shown in the Figures may be employed to achieve desired magnetic field shaping and eddy current flow prevention.

Figure 4:
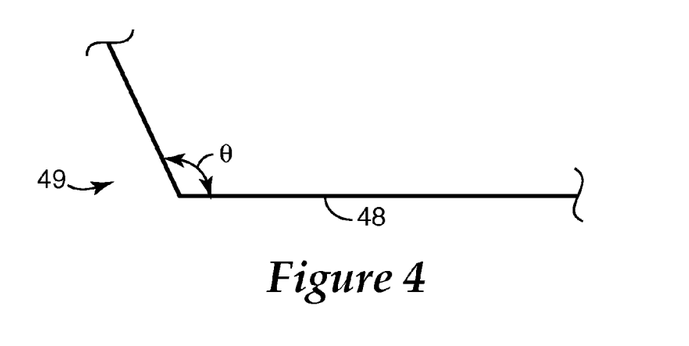
FIG. 4 shows a bended peripheral portion of a magnetic shielding apparatus according to embodiments of the present invention.

As is shown in FIG. 4, a peripheral edge portion of the magnetic shield 48 may be bent upward at a desired angle, θ, to further reduce the reluctance path of flux generated by the drive coil of the digitizer. The angle, θ, of the bend 49 formed along the peripheral edge of the magnetic shield plate 48 can be varied, for example, to achieve desired reluctance path characteristics.

Figure 5:
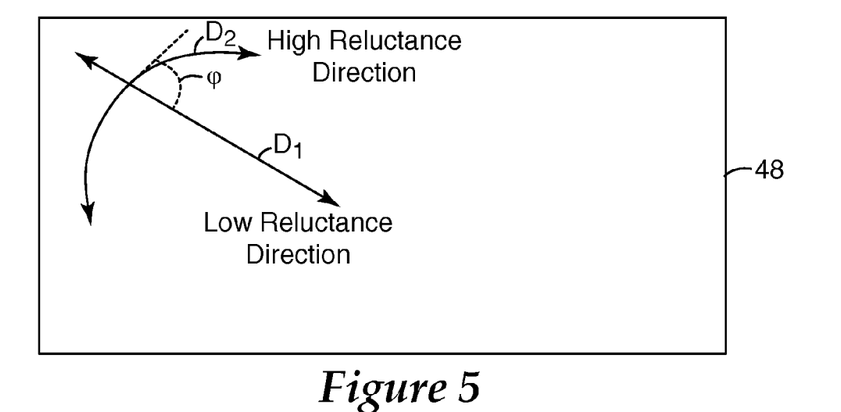
FIGS. 5-7 show embodiments of magnetic shields that provide for preferential directivity of reluctance and/or electrical resistance characteristics in accordance with the present invention.
Figure 6:
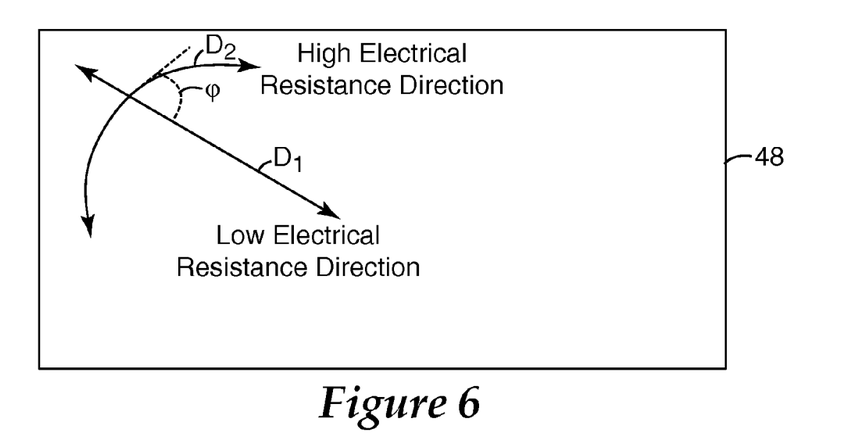
Figure 7:
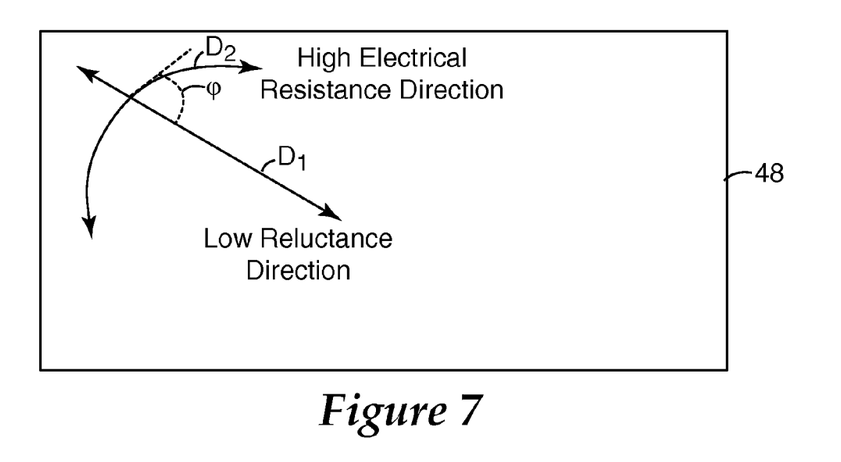

FIGS. 5-7 show embodiments of a magnetic shield 48 of the present invention that provide for preferential directivity of reluctance and/or electrical resistance characteristics in the shield plate 48. According to the embodiment shown in FIG.

5, a magnetic shield 48 is fabricated to have relatively low reluctance in one direction, $D_1$, and relatively high reluctance in a different direction, $D_2$. The two directions, $D_1$ and $D_2$, may be approximately orthogonal to one another, as is shown by angle φ. The magnetic shield 48 is preferably fabricated so that reluctance is low in a radial direction, $D_1$, while reluctance is high in a circumference direction, $D_2$. The relative difference in reluctance in the two directions $D_1$ and $D_2$ may be 5:1 or greater.

According to the embodiment shown in FIG. 6, a magnetic shield 48 is fabricated to have relatively low electrical resistance in one direction, $D_1$, and relatively high electrical resistance in a different direction, $D_2$. The two directions, $D_1$ and $D_2$, may be approximately orthogonal to one another, as is shown by angle φ. The magnetic shield 48 is preferably fabricated so that electrical resistance is low in a radial direction, $D_1$, while electrical resistance is high in a circumference direction, $D_2$. The relative difference in electrical resistance in the two directions $D_1$ and $D_2$ may be 5:1 or greater.

As is shown in FIG. 7, embodiments of the present invention are further directed to a magnetic shield 48 with low reluctance in one direction, $D_1$, and high electrical resistance in a different direction, $D_2$. The two directions $D_1$ and $D_2$ may be orthogonal, for example. The magnetic shield 48 may be fabricated so that reluctance is low in a radial direction, $D_1$, while electrical resistance is high in a circumference direction, $D_2$.

Although the angle φ defined between the directions of low and high reluctance/electrical resistance in FIGS. 5-7 is preferably about 90°, the angle φ may vary by several or tens of degrees from orthogonal. Moreover, the angle φ may vary as a function of position across the surface of the magnetic shield plate 48. For example, an angle $φ_1$ may be defined between directions $D_1$ and $D_2$ at a surface position proximate the peripheral edge of the shield plate 48, and vary as a function of shield plate position until an angle $φ_N$ is defined between directions $D_1$ and $D_2$ at a position proximate the center of the shield plate 48.

Figure 8:
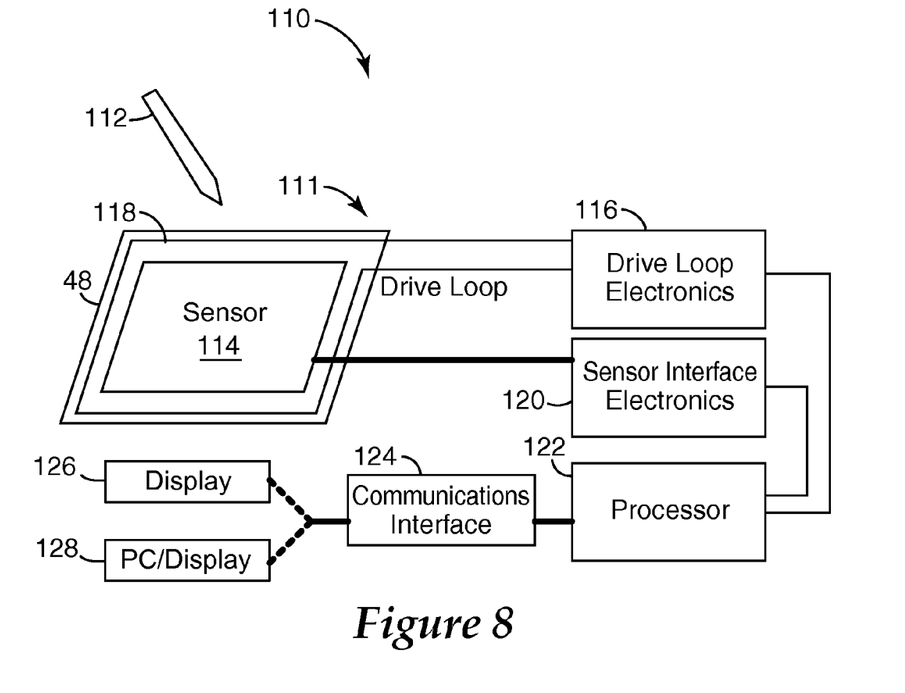
FIG. 8 is a diagram of a location sensing system that includes an untethered stylus and a location sensing device that incorporates a magnetic shielding apparatus in accordance with embodiments of the present invention.

Turning now to FIG. 8, there is shown an embodiment of a location sensing system that incorporates a magnetic shield 48 of the present invention. A location sensing system 110 includes a stylus 112 that interacts with a sensing device 111. The sensing device 111 includes a location sensor 114, such as a digitizer. The sensing device 111 is shown to include a drive loop or coil 118 coupled to drive loop electronics 116 that cooperate to generate a magnetic field, which may be a continuously varying magnetic field having a single frequency or multiple frequency components.

A magnetic shield 48 of a type previously described is situated under the sensor 114 and the drive coil 118. The magnetic shield 48 preferably increases field strength over the surface of the location sensor 114 at reduced levels of applied power, reduces magnetic field coupling to nearby conductive components, and reduces eddy currents that would decrease magnetic field strength in the stylus operating area. The magnetic shield 48 also shields the magnetic field from radiating behind the surface of location sensor 114.

The stylus 112 is preferably configured as a tetherless or cordless implement. The stylus 112 derives power from the magnetic field generated by the sensing device 111. The stylus 112, having derived power from the magnetic field emanating from the drive coil 118, is configured to broadcast a signal from which stylus location and status may be determined by the sensing device 111. Although preferred embodiments of an untethered stylus do not include a battery, some embodiments may employ a battery, such as a rechargeable battery that is recharged from energy derived from the magnetic field of the drive signal. A battery may be used to provide power to various circuits of the stylus, such as a modulator or pressure sensor (e.g., tip or eraser pressure sensor).

The stylus 112 is preferably configured to include one or more user-actuatable buttons or switches, such as those commonly employed to implement various mouse functions (e.g., right and left mouse buttons). The tip of the stylus 112 may incorporate a pressure sensor from which applied pressure can be resolved and transmitted to the sensing device 111. Eraser functionality may also be incorporated in the form of a switch or pressure sensor at the stylus end opposite the tip.

Sensor interface electronics 120 is coupled to the sensor 114 and facilitates measurement of signals developed at the sensor 114 in response to signals broadcast by the stylus 112. The sensor interface electronics 120 is preferably connected to the sensor 114 via a shielded connector. The sensor interface electronics 120 includes circuitry for measuring the signal levels present on the individual traces of the sensor 114, and is typically configured to reject as much noise as possible.

According to one configuration, the sensor 114 includes a digitizer that incorporates a detection grid and electronics as is known in the art. For example, such a detection grid may include pairs of position resolving conductors each of which forms one or more differential coil elements in the sensor 114, with each conductor pair receiving a magnetic signal transmitted by the stylus 114. An illustrative example of a digitizer having such a detection grid configuration, elements of which may be employed in a location sensor system of the present invention, is disclosed in U.S. Pat. Nos. 4,786,765; 5,218,174; 5,633,471; 5,793,360; 6,667,740; and 7,019,672; which are hereby incorporated herein by reference.

According to another configuration, the sensing device 111 may incorporate a sensor 114 that effectively incorporates a stylus digitizer and a touch-sensitive sensor. The digitizer, according to this configuration, allows the location and status of the stylus 112 to be determined. The touch-sensitive sensor allows the location of a finger touch to be determined. This configuration allows a user to use either the stylus 112 or a finger to indicate a desired location on a computer display, for example, as well as determine the location and status of the stylus 112.

The touch-sensitive sensor 114 typically includes a matrix that capacitively couples to the stylus 112 and/or a finger. In this configuration, the sensor 114 of the sensing device 111 is preferably made up of a series of transparent conductors arranged on a glass or plastic cover that can be placed in front of an LCD display. One side of the glass or plastic sheet has conductors in the X direction, and the opposite side has conductors in the Y direction. Examples of suitable touch-sensitive sensors 114 are disclosed in commonly owned U.S. Pat. Nos. 6,133,906 and 6,970,160, in commonly owned U.S. Published Application No. 2005/0083307, in U.S. Pat. Nos. 6,762,752 and 6,690,156, and in U.S. Published Application No. 2004/0095333, each of which is hereby incorporated herein by reference.

A system embodiment that incorporates a digitizer and touch-sensitive sensor advantageously allows a user to point a stylus at a computer display and have the location and status of the pointing device determined and, when a finger is used to point at the display device, allows for the determination of the location of a finger touch at the display device. The dual use aspects of this embodiment of a sensing device 111 make it particularly useful in tablet PC applications.

For example, a digitizer arrangement allows a user to use a stylus to input information, indicate operations the user wants to take, and write or draw on the display. The touch-sensitive sensor allows the user to "type" information onto a virtual keyboard on the display screen, for example. This would allow the vendor of the computing system, in which a dual touch location sensor system of the present invention is implemented, to eliminate the keyboard and the associated bulk it requires. It is understood that a digitizer and a touch-sensitive sensor need not be implemented together in all configurations, but inclusion of both sensing devices provides for enhanced user interaction with a computing system that incorporates a sensing system 110 of the present invention.

According to one illustrative embodiment, the drive coil 118 may be constructed of wire, such as 36 gauge wire, looped several times (e.g., 4 times) around the periphery of the frame of sensing device 111. In one implementation, the drive coil 118 may have an inductance of about 21 µH and an impedance of about 14 Ohms at 100 kHz. The drive coil 118 is connected to a signal generator of the drive loop electronics 16. The signal generator may be configured to produce signals comprising 200 periods of a 100 kHz sine wave signal gated at 250 Hz, for example. The signal generator may, for example, produce an output signal of 0.4 $V_{pp}$, resulting in approximately 28 mA of current that flows in the drive coil 118.

Figure 9:
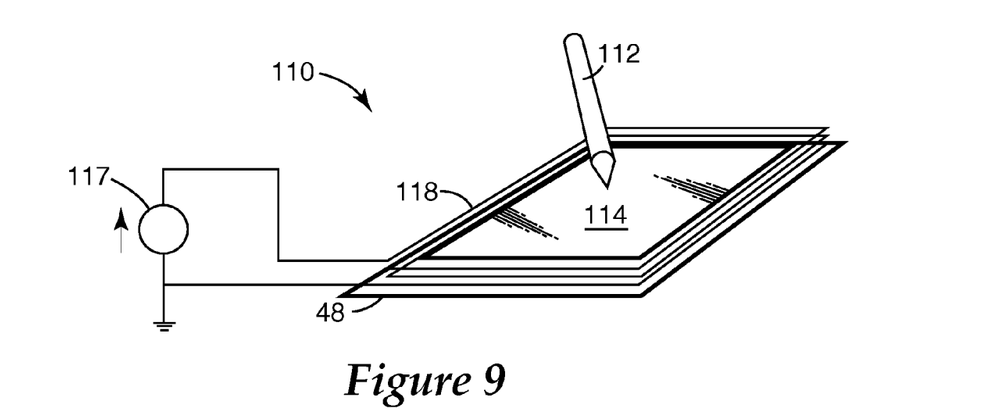
FIG. 9 is a diagram of an apparatus for generating an excitation magnetic field which is received by a stylus, the apparatus incorporating a magnetic shielding apparatus in accordance with embodiments of the present invention.

FIG. 9 is a simplified illustration of drive coil 118 and a signal generator 117 that cooperate to generate a magnetic excitation field. In this illustrative example, one or more coils are preferably arranged in the plane of the location sensor 114. The coils are typically arranged in a rectangular shape, but may take on other shapes as discussed above. A sinusoidal current is produced by the signal generator 117 with peak magnitude $A_1$ at radian frequency $\omega_1$ and is applied to the rectangular coil 118.

The stylus 112 is configured to collect energy from the magnetic field emanating from the drive coil 118 using a tank circuit. The tank circuit may initially be tuned to resonate at the frequency that the drive coil 118 is driven. In this illustrative example, the frequency is set at 100 kHz. The tank circuit of the stylus 112 builds amplitude during the burst produced by the drive coil 118 and then gradually loses signal amplitude after the drive coil 118 is turned off. The time associated with the exponential charging and discharging of the resonant tank circuit of the stylus 112 is determined by the capacitive and inductive elements in the tank circuit. Changes in the resonance frequency of the tank circuit, due to drift or purposeful modification (e.g. resulting from stylus switch state changes), may be accommodated by detecting and/or tracking such changes by the sensing device 111. Alternatively, the resonance frequency of the tank circuit can be modified to track changes in the drive frequency of the magnetic field emanating from the drive coil 118.

In some embodiments, the location sensor 114 includes a matrix that capacitively couples to the stylus 112. In other embodiments, the invention may be implemented with magnetic-sensing digitizer systems as are known in the art. An untethered magnetic stylus is similar to a capacitive stylus, except the resonant tank circuit of the magnetic stylus need not be connected to a tip or to a shield of the stylus. Untethered magnetic styluses are well known in the art, and are described in previously incorporated U.S. Pat. Nos. 4,786,765; 5,633,471; 5,793,360; 6,667,740, and 7,019,672. Embodiments of the present invention that are implemented using an untethered magnetic stylus may employ a location sensor that includes multiple drive loops as disclosed in the referenced patents. In such embodiments, a separate sensing grid and separate drive loops need not be used. Rather, each of the drive loop coils is alternately coupled to transmitting circuitry and then to receiving circuitry to alternately transmit and receive from one of multiple drive loop coils that are placed in the active area, typically under the display.

Referring again to FIG. 8, a processor 122 is coupled to the drive loop electronics 116, sensor interface electronics 120, and a communications interface 124. The processor 122 coordinates the operations of drive loop electronics 116 and sensor interface electronics 120, and is configured to determine stylus status and stylus/finger location and/or angle. Stylus status and stylus/finger location and/or angle determinations are preferably made by the processor 122 in accordance with the methodologies disclosed in commonly owned U.S. patent application Ser. No. 11/557,829, entitled "Touch Location Sensing System and Method Employing Sensor Data Fitting to a Predefined Curve," filed on Nov. 8, 2006, which is hereby incorporated herein by reference.

The stylus location and status information computed by the processor 122 is communicated to a computer and/or display 126 via the communications interface 124. The communications interface 124 may be configured as an RS-232 or USB interface, for example. The processor 122 may be configured to drive a display 126 directly. Alternatively, a computer 128 may be coupled to the communications interface 124 and receive the location and status information from the processor 122, and drive its display. The processor 122 or computer 128 may be configured to control cursor velocity, momentum and other factors to enhance the user experience with the sensing system 111.

It is noted that demodulator circuitry may be included within sensor interface electronics 120 to recover stylus status data, and that this status data may be communicated to the processor 122. For example, known amplitude demodulation circuitry may be employed to detect the amplitude modulation of a received stylus signal. Known frequency demodulation circuitry may be used to detect the frequency of the amplitude modulation, such frequency indicating the state of a stylus status switch for example.

The foregoing description of the various embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An apparatus, comprising:
   a location sensing surface;
   a drive coil disposed about a periphery of the location sensing surface; and a magnetic shield plate disposed below the location sensing surface and the drive coil, the shield plate comprising a plurality of radially oriented slots originating at, and distributed about, a periphery of the shield plate,
   wherein at least some of the slots are curved.

2. The apparatus of claim 1, wherein the shield plate is fabricated from a ferrous metal.

3. The apparatus of claim 1, wherein the shield plate is fabricated from steel.

4. The apparatus of claim 1, wherein the drive coil is arranged in a substantially circular or rectangular shape.

5. The apparatus of claim 1, wherein the shield plate comprises a bent portion extending along the periphery of the shield plate.

6. The apparatus of claim 1, wherein the shield plate comprises at least one pattern of slots arranged near the drive coil and oriented parallel to the drive coil.

* * * * *